(12) United States Patent
Nakagawa et al.

(10) Patent No.: US 7,352,017 B2
(45) Date of Patent: Apr. 1, 2008

(54) NITRIDE SEMICONDUCTOR DEVICE AND MANUFACTURING METHOD THEREOF

(75) Inventors: Atsushi Nakagawa, Kamifukuoka (JP); Eiji Waki, Kamifukuoka (JP)

(73) Assignee: New Japan Radio Co., Ltd., Tokyo-To (JP)

( * ) Notice: Subject to any disclaimer, the term of this patent is extended or adjusted under 35 U.S.C. 154(b) by 211 days.

(21) Appl. No.: 11/110,720

(22) Filed: Apr. 21, 2005

(65) Prior Publication Data

US 2005/0236643 A1    Oct. 27, 2005

(30) Foreign Application Priority Data

Apr. 21, 2004  (JP) .............................. 2004-125322

(51) Int. Cl.
*H01L 29/739*    (2006.01)
*H01L 29/24*    (2006.01)

(52) U.S. Cl. ................. 257/194; 257/103; 257/29.246; 257/29.247; 257/29.252; 438/167; 438/172

(58) Field of Classification Search ................ 257/103, 257/11, 194, 29.246, E29.247, E29.249, E29.252, 257/E21.403, E21.407; 438/22, 48, 167, 438/172

See application file for complete search history.

(56) References Cited

U.S. PATENT DOCUMENTS

2003/0203604 A1*  10/2003  Makita ..................... 438/571

FOREIGN PATENT DOCUMENTS

JP        10-335637        12/1998

OTHER PUBLICATIONS

Y. Ohno, et al.; "International Conference on Nitride Semiconductor, Nara, 2003, Tu-P2. 067" (p. 375).

* cited by examiner

Primary Examiner—Long K. Tran
(74) Attorney, Agent, or Firm—Antonelli, Terry, Stout & Kraus, LLP.

(57) ABSTRACT

A nitride semiconductor device enabling to supress current collapse and manufacturing method thereof including a III-V group nitride semiconductor layer formed of III group elements includes at least one element from the group consisting of gallium, aluminum, boron and indium, and V group elements including at least nitrogen from the group consisting of nitrogen, phosphorous and arsenic, comprising a first nitride semiconductor layer made of said III-V group nitride semiconductor layer deposited on a substrate, a second nitride semiconductor layer comprising said III-V group nitride semiconductor layer and a control electrode making Schottky contact with the first nitride semiconductor layer being exposed through removing a portion of the second semiconductor layer.

2 Claims, 6 Drawing Sheets

SWEEP VOLTAGE:10V

SWEEP VOLTAGE:20V

SWEEP VOLTAGE:30V

SWEEP VOLTAGE:40V

SWEEP VOLTAGE:10V

SWEEP VOLTAGE:20V

SWEEP VOLTAGE:30V

SWEEP VOLTAGE:40V

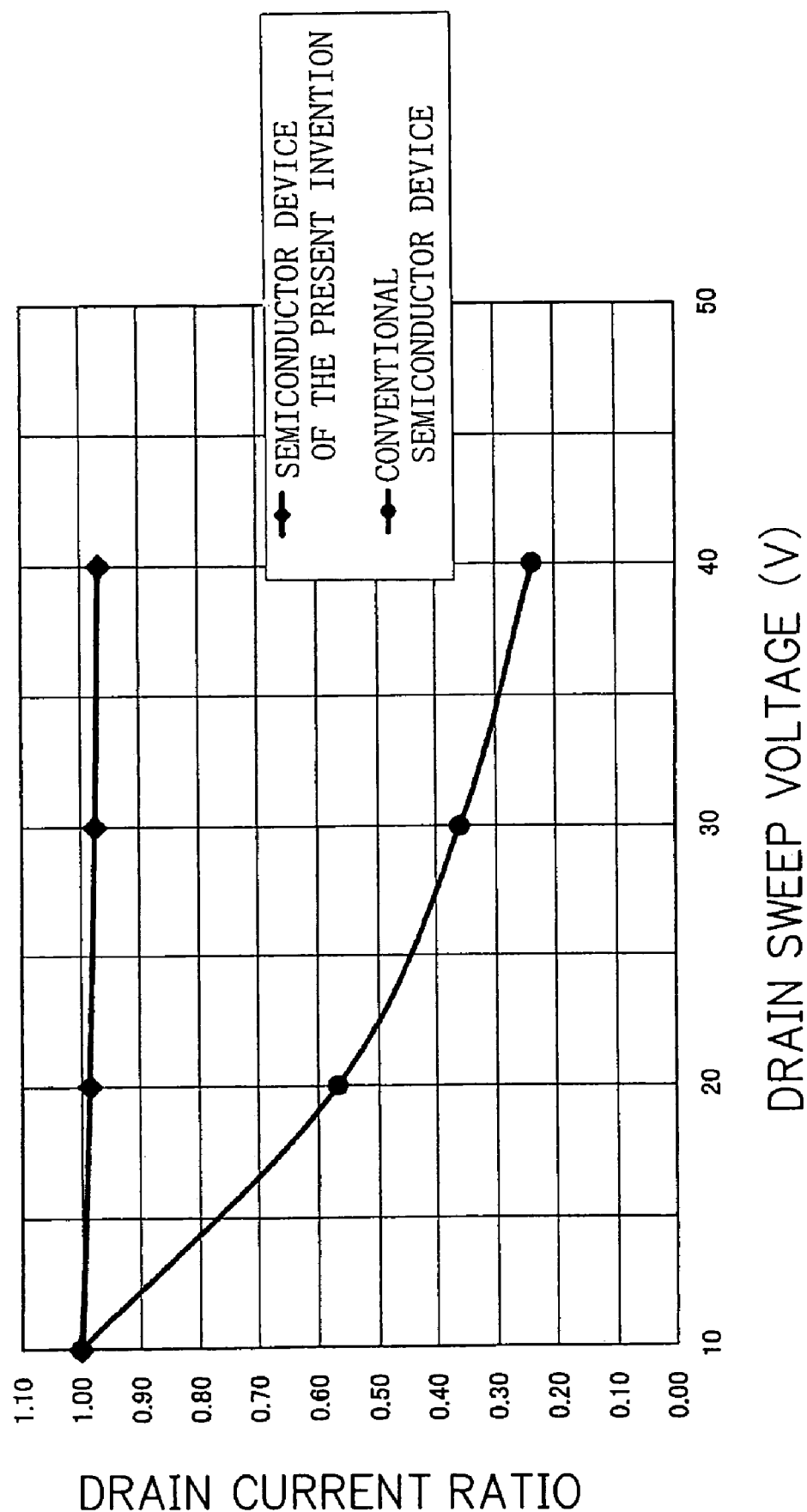

NITRIDE SEMICONDUCTOR DEVICE AND MANUFACTURING METHOD THEREOF

BACKGROUND OF THE INVENTION

The present invention relates to a nitride semiconductor device where a nitride semiconductor is used as an active layer and a manufacturing method for the same, and in particular, to a nitride semiconductor device having, a control electrode that makes Schottky contact with the semiconductor device, such as a high electron mobility transistor (HEMT) and a field effect transistor (FET), and a manufacturing method thereof.

FIG. 6 is a cross sectional diagram of a semiconductor device made of a conventional III-V group nitride semiconductor. The semiconductor device shown in FIG. 6 has a so-called HEMT structure where a buffer layer 102 made of gallium nitride (GaN), a channel layer 103 made of gallium nitride, a charge supply layer 104 made of n type aluminum gallium nitride (AlGaN) and a Schottky layer 105 made of undoped aluminum gallium nitride are sequentially deposited on a substrate 101 made of a sapphire substrate, where a two-dimensional electron gas layer made of a potential well and having an extremely high electron mobility is formed in the vicinity of the interface where the channel layer 103 and the charge supply layer 104 form a hetero junction. In the semiconductor device having such a structure, a voltage that is applied to a gate electrode 106 (control electrode) that makes Schottky contact with the Schottky layer 105 is controlled, and thereby, carriers (two-dimensional electron gas) that flow between a source electrode 107a and a drain electrode 107b are controlled.

A variety of structures as disclosed in, for example, Japanese Unexamined Patent Publication No. 335637/1998, in addition to the above described structure.

SUMMARY OF THE INVENTION

However, a problem arises in a conventional semiconductor device, where a gate electrode is formed on a nitride semiconductor layer, such as an aluminum gallium nitride (AlGaN) layer or a gallium nitride (GaN) layer, where electrons that have been trapped in the surface level of the nitride semiconductor layer causes the potential of the surface fluctuate, and thereby, a phenomenon (hereinafter referred to as current collapse) where the drain current decreases from the value that has been measured in a quasi-static manner under an operation with a high drain voltage. An object of the present invention is to provide a nitride semiconductor device that can suppress current collapse and a manufacturing method for the same.

In order to achieve the above described object, a nitride semiconductor device according to the present invention includes a nitride semiconductor device, including a III-V group nitride semiconductor layer formed of III group elements including at least one element from the group consisting of gallium, aluminum, boron and indium, and V group elements including at least nitrogen from the group consisting of nitrogen, phosphorous and arsenic, including a first nitride semiconductor layer made of the III-V group nitride semiconductor layer deposited on a substrate, a second nitride semiconductor including the III-V group nitride semiconductor layer deposited on the first nitride semiconductor layer and not including aluminum, and a control electrode making Schottky contact with the first nitride semiconductor layer being exposed through a portion of the second nitride semiconductor layer that has been removed, wherein the second nitride semiconductor layer is made of a film of which the film formation temperature is lower than that of the first nitride semiconductor layer.

In order to achieve the above described object, a nitride semiconductor device according to the present invention includes a nitride semiconductor device, including a III-V group nitride semiconductor layer formed of III group elements including at least one element from the group consisting of gallium, aluminum, boron and indium, and V group elements including at least nitrogen from the group consisting of nitrogen, phosphorous and arsenic, including a first nitride semiconductor layer made of the III-V group nitride semiconductor layer deposited on a substrate, a second nitride semiconductor including the III-V group nitride semiconductor layer deposited on the first nitride semiconductor layer and not including aluminum, and a control electrode making Schottky contact with the first nitride semiconductor layer being exposed through a portion of the second nitride semiconductor layer that has been removed, wherein the second nitride semiconductor layer is made of crystallinity with minute grains.

In order to achieve the above described object, a nitride semiconductor device according to the present invention includes a nitride semiconductor device as described herein, wherein the first nitride semiconductor layer is made of the III-V group nitride semiconductor layer including at least aluminum.

In order to achieve the above described object, a nitride semiconductor device according to the present invention includes a nitride semiconductor device as described herein, wherein the nitride semiconductor device comprises a third nitride semiconductor layer made of the III-V group nitride semiconductor layer having an energy gap that is smaller than the energy gap of the first nitride semiconductor layer between the substrate and the first nitride semiconductor layer.

In order to achieve the above described object, a nitride semiconductor device according to the present invention includes a nitride semiconductor device as described herein, wherein the nitride semiconductor device comprises a control electrode making Schottky contact with the first nitride semiconductor layer being exposed through a portion of the second nitride semiconductor layer, where the portion is a region where the control electrode is planned to be formed, that has been removed, and a source electrode and a drain electrode which make ohmic contact with the first nitride semiconductor layer in a manner where a current that flows through a channel that is made of the first nitride semiconductor layer or a channel that is formed between the third nitride semiconductor layer and the first nitride semiconductor layer is controlled by a voltage that is applied to the control electrode.

In order to achieve the above described object, the present invention includes a manufacturing method for a nitride semiconductor device, including a III-V group nitride semiconductor layer that is formed of III group elements that include at least one element from the group consisting of gallium, aluminum, boron and indium, and V group elements that include at least nitrogen from the group consisting of nitrogen, phosphorous and arsenic, wherein the manufacturing method comprises the steps of forming a first nitride semiconductor layer of the III-V group nitride semiconductor layer on a substrate; forming a second nitride semiconductor layer of the III-V group nitride semiconductor layer having crystallinity with minute grains that do not include aluminum at a temperature that is lower than the film formation temperature at the time of forming the first nitride semiconductor layer on the first nitride semiconductor layer; creating a recess through which a portion of the first nitride semiconductor layer is exposed by removing a portion of the second nitride semiconductor layer, where the portion is a region where a control electrode is planned to be formed; and forming a control electrode on the first nitride semiconductor layer that is exposed within the recess.

In order to achieve the above described object, the present invention includes a manufacturing method for a nitride semiconductor device, including a III-V group nitride semiconductor layer that is formed of III group elements that include at least one element from the group consisting of gallium, aluminum, boron and indium, and V group elements that include at least nitrogen from the group consisting of nitrogen, phosphorous and arsenic, wherein the manufacturing method comprises the steps of forming a first nitride semiconductor layer containing aluminum of the III-V group nitride semiconductor layer on a substrate; forming a second nitride semiconductor layer of the III-V group nitride semiconductor layer having crystallinity with minute grains that do not include aluminum at a temperature that is lower than the film formation temperature at the time of forming the first nitride semiconductor layer on the first nitride semiconductor layer; creating a recess through which a portion of the first nitride semiconductor layer is exposed by removing a portion of the second nitride semiconductor layer, where the portion is a region where a control electrode is planned to be formed; and forming a control electrode which makes Schottky contact with the first nitride semiconductor layer on the first nitride semiconductor layer that is exposed within the recess.

In order to achieve the above described object, the present invention includes a manufacturing method for a nitride semiconductor device as described herein, wherein the manufacturing method comprises the step of forming a third nitride semiconductor layer of the III-V group nitride semiconductor layer, having an energy gap that is smaller than the energy gap of the first nitride semiconductor layer, on the substrate, so that the first nitride semiconductor layer is formed on the third nitride semiconductor layer.

In order to achieve the above described object, the present invention includes a manufacturing method for a nitride semiconductor device as described herein, wherein the manufacturing method comprises the steps of creating another recess through which a portion of the first nitride semiconductor layer is exposed by removing portions of the second nitride semiconductor layer, where the portions are regions where a source electrode and a drain electrode are planned to be formed; forming the source electrode and the drain electrode, which make ohmic contact with the first nitride semiconductor layer, on the first nitride semiconductor layer that is exposed within the other recess; creating the recess through which a portion of the first nitride semiconductor layer is exposed by removing a portion of the second nitride semiconductor layer where the portion is a region where a control electrode is planned to be formed; and forming the control electrode, which makes Schottky contact with the first nitride semiconductor layer, on the first nitride semiconductor layer that is exposed within the recess.

A nitride semiconductor device according to the present invention has a structure where a second nitride semiconductor layer (cap layer) that does not include aluminum is provided on a first nitride semiconductor layer (Schottky layer) with which a control electrode is made to make contact, and the control electrode is formed within a recess that is created by removing a portion of the cap layer through etching, and furthermore, the cap layer has crystallinity with miute grains which have been grown at a temperature lower than the film formation temperature of the Schottky layer and which has high insulation, and therefore, the current collapse is suppressed, through the control of electrons which are trapped in the surface level or through reduction of the surface level density, and thus, high-frequency characteristics are improved.

Furthermore, in accordance with a manufacturing method for a nitride semiconductor device according to the present invention, a nitride semiconductor device having a desired structure can be formed by controlling the temperature for epitaxial growth in a conventional process for manufacturing a nitride semiconductor device, and therefore, the manufacturing process has good reproducibility, and nitride semiconductor devices having excellent properties can be manufactured with a high yield.

BRIEF DESCRIPTION OF THE DRAWINGS

FIG. 4 is a graph showing the effects of the present invention;

DETAILED DESCRIPTION

The nitride semiconductor device of the present invention is explained in detail in following.

Embodiment 1

Figure 1:
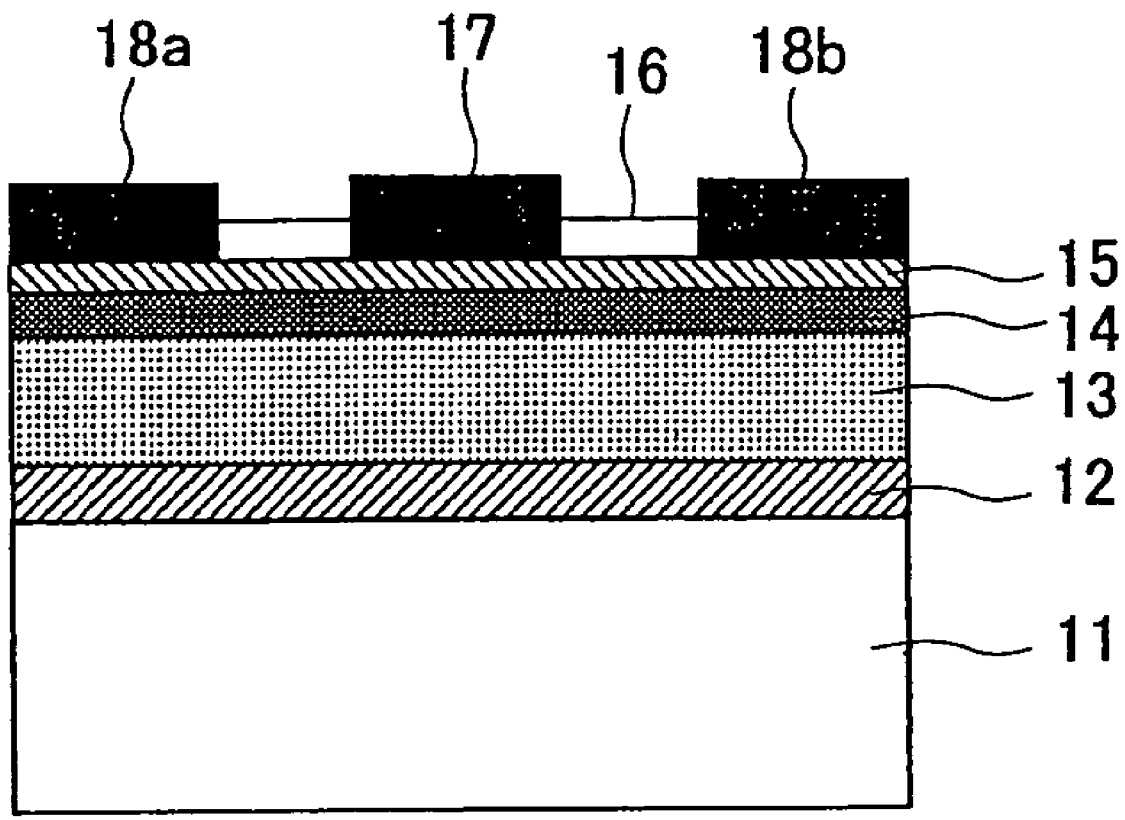
FIG. 1 is a diagram showing Embodiment 1 of the present invention.
Figure 2A:
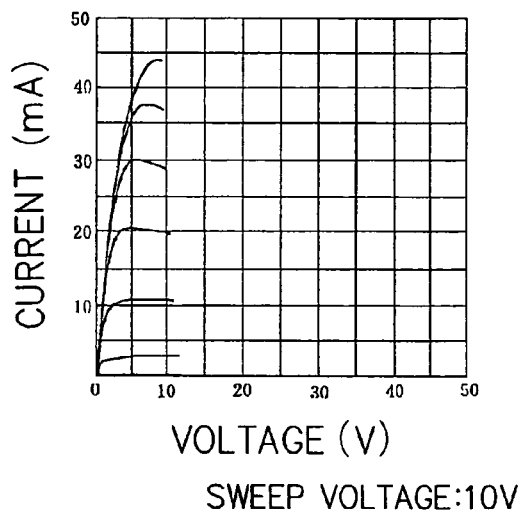
FIGS. 2(a) to 2(d) are graphs showing the drain current-voltage properties of Embodiment 1 of the present invention.
Figure 2B:
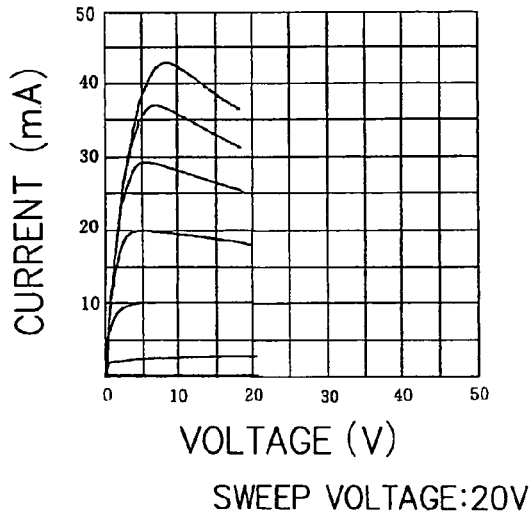
Figure 2C:
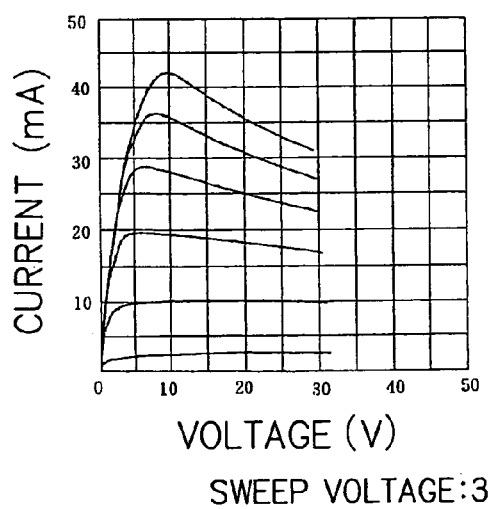
Figure 2D:
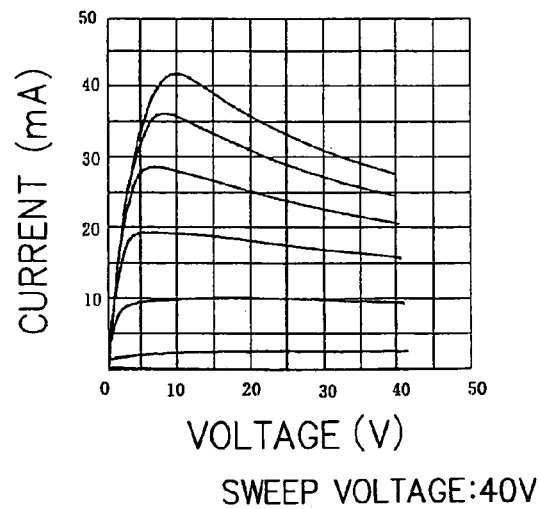
Figure 3A:
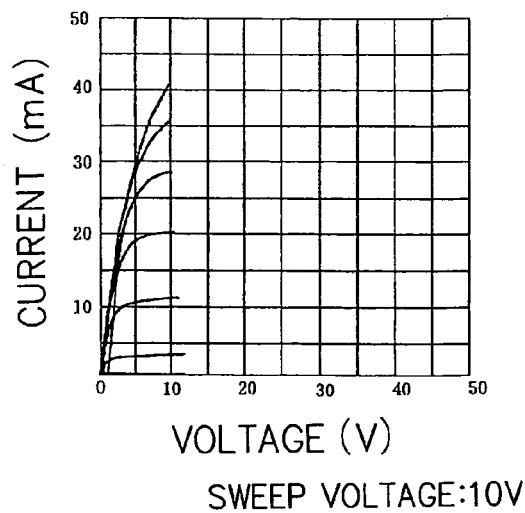
FIGS. 3(a) to 3(d) are graphs showing the drain current-voltage properties of a conventional nitride semiconductor device.
Figure 3B:
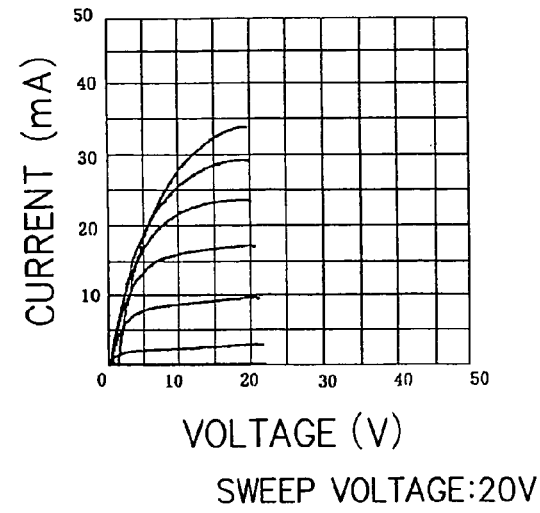
Figure 3C:
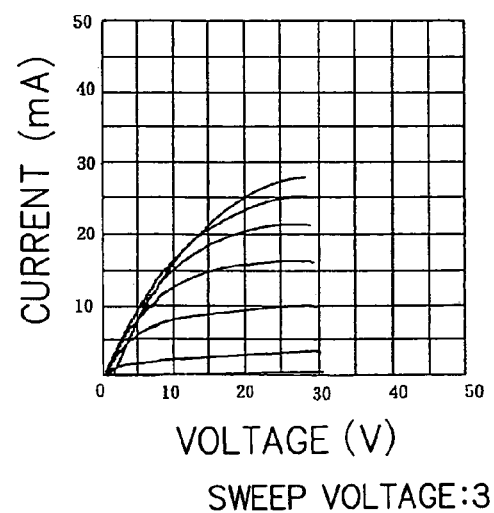
Figure 3D:
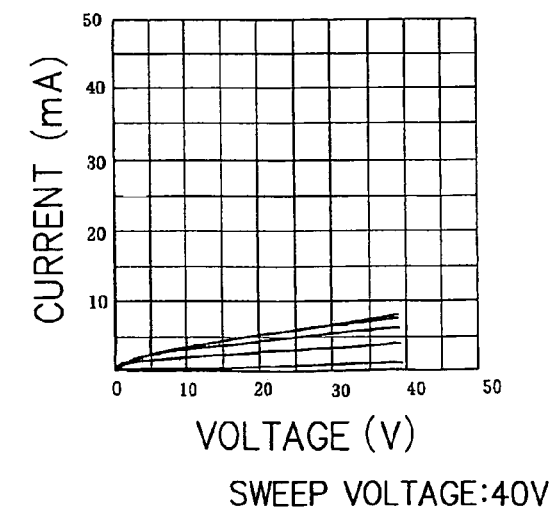
Figure 5A:
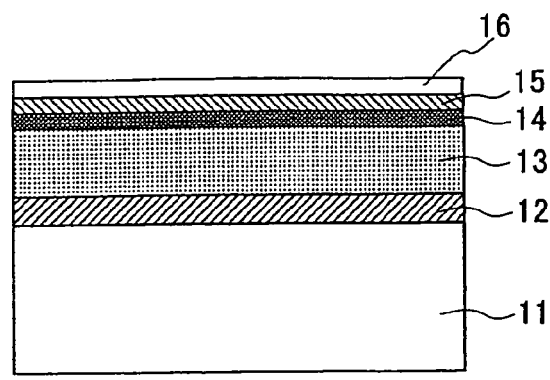
FIGS. 5(a) to 5(d) are diagrams showing Embodiment 2 of the present invention.
Figure 5B:
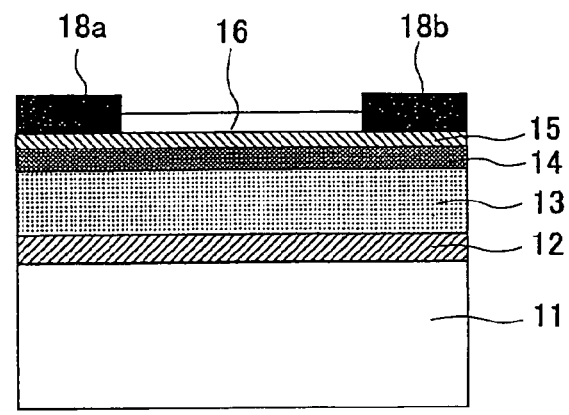
Figure 5C:
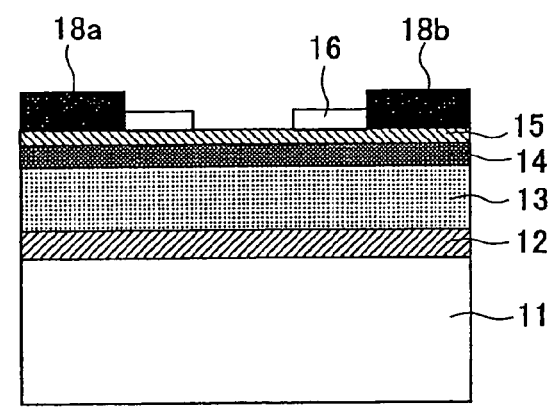
Figure 5D:
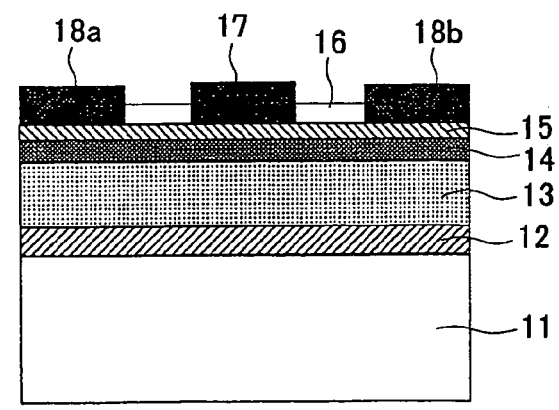

FIG. 1 is a cross sectional diagram of a HEMT which is a III-V group nitride semiconductor device according to Embodiment 5 of the present invention. As shown in FIG. 1, a buffer layer 12 made of nitride gallium (GaN) and having a thickness of approximately 30 nm, a channel layer 13 having an energy gap that is smaller than the energy gap of the below described charge supply layer, a thickness of 2 µm and made of undoped gallium nitride (GaN), a charge supply layer 14 having a thickness of 15 nm and made of n type aluminum gallium nitride (AlGaN) where a two-dimensional electron gas layer which becomes carriers is formed in the interface between the channel layer 13, and a Schottky layer 15 having a thickness of 3 nm and made of undoped aluminum gallium nitride (AlGaN), and a cap layer 16 having a thickness of 10 nm and made of undoped gallium nitride (GaN) having crystallinity with minute grains are formed and deposited on a substrate 11 made of sapphire. A portion of the cap layer 16 is removed, and thus, a recess through which the Schottky layer 15 is exposed is created. A gate electrode 17 made of a deposited body of nickel (Ni)/gold (Au) is formed on the Schottky layer 15 that is exposed within the recess, which is a region where a gate electrode is planned to be formed, so as to make Schottky contact with the Schottky layer 15. In addition, a source electrode 18a and a drain electrode 18b are formed of titanium (Ti)/aluminum (Al) on the Schottky layer 15 that is exposed within the recess, which is the region where the source electrode and the drain electrode are planned to be formed, so as to make ohmic contact with the charge supply layer 14.

The Cap layer 16 having crystallinity with minute grains is formed as a film at a temperature that is lower than the film formation temperature of the charge supply layer 14 and the Schottky layer 15 by approximately 500° C. according to an MOCVD (metal organic chemical vapor deposition) method, an MBE (Molecular Beam Epitaxy) method or the like, and thereby, becomes a semiconductor layer having high insulation. Concretely speaking, the cap layer 16 has a high resistance, where the sheet resistance is $10^9$ Ω/□ or higher.

Figure 6:
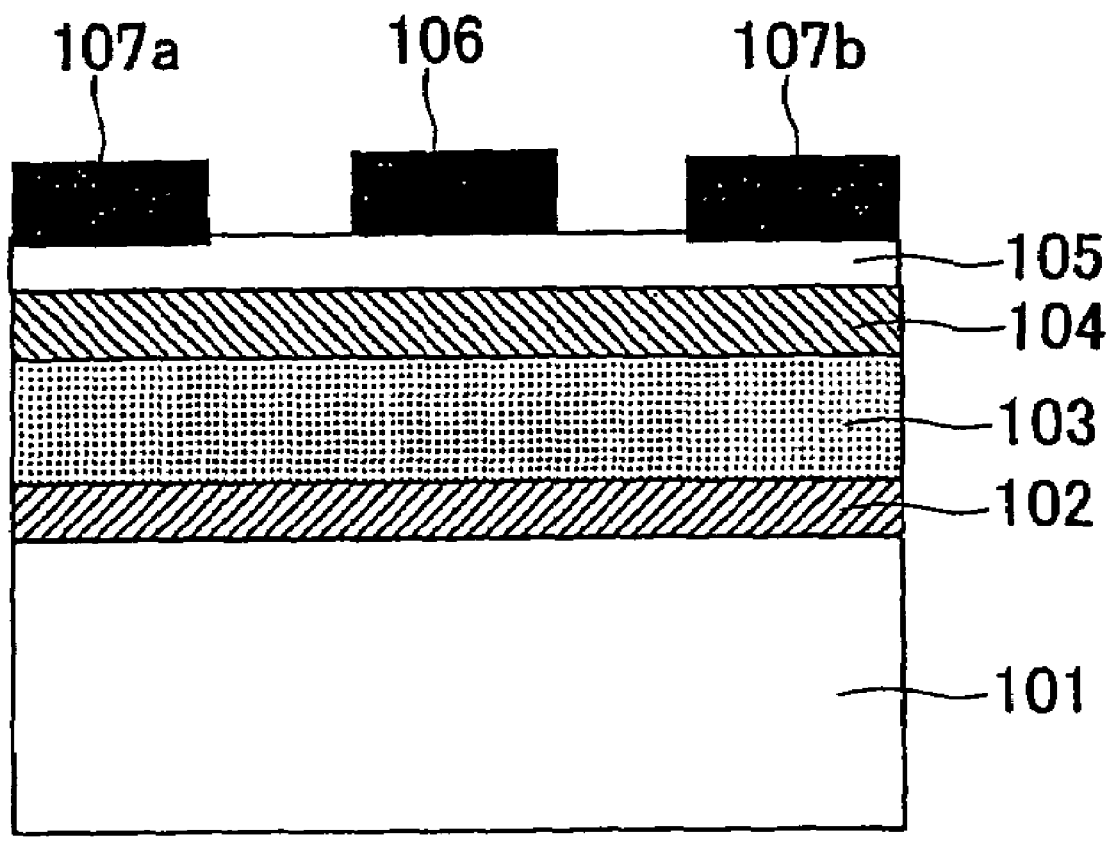
FIG. 6 is a diagram showing a conventional nitride semiconductor device.

FIGS. 2(*a*) to 2(*d*) show the drain current-voltage properties of the HEMT, which is a nitride semiconductor device having the structure shown in FIG. 1. For the purpose of comparison, FIGS. 3(*a*) to 3(*d*) show the drain current-voltage properties of the HEMT having the structure shown in FIG. 6. In FIGS. 2(*a*) to 2(*d*) and FIGS. 3(*a*) to 3(*d*), measurements are carried out for the sweep voltages of the drain, 0 V to 10 V, 0 V to 20 V, 0 V to 30 V and 0 V to 40V, respectively, and for the gate voltages from −4 V to +2 V, in increments of 1 V. The period of measurement is 10 ms, the gate voltage is applied with a pulse width of 300 μsec, and the drain voltage is increased to the respective sweep voltage values from 0 V in steps.

When the present invention and the prior art are compared, it is found that the dispension in the properties is small in the present invention, while the properties dispense to a great extent in the prior art, when the sweep voltage of the drain is increased. FIG. 4 is a graph where such dispension in the properties are compared, and shows the ratio of change in the drain current when the sweep voltage is increased, using as a reference the drain current for a drain voltage of 10 V and a gate voltage of +2 V in the respective FIGS. 2(*a*) to 2(*d*) and FIGS. 3(*a*) to 3(*d*). As shown in FIG. 4, the drain current greatly decreases as the sweep voltage increases and the drain current decreases to approximately 25% when the sweep voltage is 40 V in the prior art. In contrast to this, approximately 97% of the current is maintained in the present invention. It can be seen that, as described above, the effects of suppressing current collapse are very significant in the present invention.

Embodiment 2

Next, a manufacturing method for a HEMT which is a III-V group nitride semiconductor device having the structure shown in the above described Embodiment 2 is cited as an example and a manufacturing method for a nitride semiconductor device according to the present second invention is described.

First, as shown in FIGS. 5(*a*) to 5(*d*), a buffer layer 12 made of gallium nitride (GaN) is grown on a substrate 11 made of sapphire so as to have a thickness of approximately 30 nm in accordance with an MOCVD method, and next, a channel layer 13 made of undoped gallium nitride (GaN) having a thickness of 2 μm, a charge supply layer 14 made of n type aluminum gallium nitride (AlGaN) having a thickness of 15 μm which forms a two-dimensional electron gas layer that becomes carriers in the interface between the channel layer 13 and a Schottky layer 15 made of undoped aluminum gallium nitride (AlGaN) having a thickness of 3 nm are sequentially grown while the temperature of the substrate is 1080° C. After that, the temperature of the substrate is lowered to 550° C., a cap layer 16 made of undoped gallium nitride (GaN) is grown so as to have a thickness of 10 nm. In this manner, the temperature of the substrate is lowered when the cap layer 16 is grown, and thereby, the cap layer 16 has crystallinity with minute grains, resulting in a layer having excellent insulating properties (FIG. 5(*a*)).

Next, portions of the cap layer 16 that are regions where a source electrode and a drain electrode are planned to be formed are removed (creation of other recesses) in accordance with a conventional lithographic method and etching method, so as to expose portions of the Schottky layer 15. A titanium (Ti) film having a thickness of 20 nm and an aluminum (Al) film having a thickness of 200 nm are deposited on the exposed Schottky layer 15 in accordance with an electron beam deposition method or the like, and heat treatment is carried out, so that a source electrode 18*a* and a drain electrode 18*b* are formed on the Schottky layer 15 so as to make ohmic contact with the charge supply layer 14 (FIG. 5(*b*)).

After that, a portion of the cap layer 16, which is a region where a gate electrode is planned to be formed, is removed (creation of a recess) in accordance with a conventional lithographic method and etching method, so as to expose a portion of the Schottky layer 15 (FIG. 5(*c*)). A nickel (Ni) film having a thickness of 20 nm, a gold (Au) film having a thickness of 300 nm and the like are deposited on the exposed Schottky layer 15 in accordance with an electron beam deposition method, and then, are patterned so that a gate electrode 17 is formed so as to make Schottky contact with the Schottky layer 15 (FIG. 5(*d*)). After this, a conventional manufacturing process for a semiconductor device is followed so as to complete the HEMT.

In the present Embodiment, according to a method for forming the cap layer 16 having crystallinity with minute grains with excellent insulating properties, the cap layer 16 is formed only by setting the formation temperature at 550° C., which is lower than the formation temperature (1080° C.) of the epitaxial layers for the channel layer 13 and the charge supply layer 14, and therefore, reproducibility is excellent. In addition, a manufacturing method according to the present invention follows a conventional manufacturing process for a semiconductor device, and therefore, provides extremely good reproducibility, and products can be manufactured with a high yield.

Though the Embodiments of the present invention are described above, the present invention is not limited to these Embodiments, but rather, can be modified in a variety of manners. Instead of the nitride semiconductor device having a HEMT structure, for example, a FET structure can be provided, where a nitride semiconductor layer to which impurities have been added is used as an active layer (channel layer) and cap layer 16 as that described above is formed on top of this active layer in the structure, and a control electrode is formed within a recess that is created by removing a portion of the cap layer through etching. In addition, nitride semiconductor layers are not limited to GaN/AlGaN based layers, but rather, the nitride semiconductor layer can be formed of a layer that includes GaN, InN or a mixed crystal compound of these and includes aluminum. In addition, the second nitride semiconductor layer (which corresponds with the cap layer 16 in the above-mentioned Embodiment) can be formed of a layer that includes GaN, InN or a mixed crystal compound of these and does not includes aluminum. In addition, the first nitride semiconductor layer (which corresponds to the charge supply layer 14 and the Schottky layer 15 in the above described Embodiment) can be formed of a layer that includes GaN, InN, AlN or a mixed crystal semiconductor of these and includes at least aluminum. Furthermore, a silicon carbide (SiC) substrate may be used instead of a sapphire substrate. In such a case, it is preferable for the buffer layer 12 to use aluminum nitride (AlN).

The composition of such as a control electrode that makes Schottky contact with the first nitride semiconductor and a source electrode that makes ohmic contact with the first nitride semiconductor layer may be appropriately selected in accordance with the types of utilized nitride semiconductor layers. In addition, instead of removing the cap layer 16 through etching, n type impurity ions may be implanted into the cap layer 16 so as to reach the charge supply layer 14, and thereby, n type semiconductor regions may be formed, so that the source electrode and the drain electrode can be formed on the cap layer 16 where n type semiconductor regions are formed.

What is claimed is:

1. A nitride semiconductor device, comprising a III-V group nitride semiconductor layer formed of III group elements including at least one element from the group consisting of gallium, aluminum, boron and indium, and V group elements including at least nitrogen from the group consisting of nitrogen, phosphorous and arsenic, comprising a first nitride semiconductor layer made of said III-V group nitride semiconductor layer deposited on a substrate, a second nitride semiconductor comprising said III-V group nitride semiconductor layer deposited on the first nitride semiconductor layer and not including aluminum, and a control electrode making Schottky contact with said first nitride semiconductor layer being exposed through a portion of the second nitride semiconductor layer that has been removed, wherein said second nitride semiconductor layer is made of crystallinity with minute grains, wherein the control electrode making Schottky contact with said first nitride semiconductor layer being exposed through a portion of said second nitride semiconductor layer, where the portion is a region where the control electrode is planned to be formed, that has been removed, and a source electrode and a drain electrode which make ohmic contact with said first nitride semiconductor layer in a manner where a current that flows through a channel that is made of said first nitride semiconductor layer or a channel that is formed between a third nitride semiconductor layer and said first nitride semiconductor layer is controlled by a voltage that is applied to said control electrode.

2. A nitride semiconductor device, comprising a III-V group nitride semiconductor layer form of III group elements including at least one element from the group consisting of gallium, aluminum, boron and indium, and V group elements including at least nitrogen from the group consisting of nitrogen, phosphorous and arsenic, comprising a first nitride semiconductor layer made of said III-V group nitride semiconductor layer deposited on a substrate, a second nitride semiconductor comprising said III-V group nitride semiconductor layer deposited on the first nitride semiconductor layer and not including aluminum, and a control electrode making Schottky contact with said first nitride semiconductor layer being exposed through a portion of the second nitride semiconductor layer that has been removed, wherein said second nitride semiconductor layer is made of a film of which the film formation temperature is lower than that of said first nitride semiconductor layer, wherein the control electrode making Schottky contact with said first nitride semiconductor layer being exposed through a portion of said second nitride semiconductor layer, where the portion is a region where the control electrode is planned to be formed, that has been removed, and a source electrode and a drain electrode which make ohmic contact with said first nitride semiconductor layer in a manner where a current that flows through a channel that is made of said first nitride semiconductor layer or a channel that is formed between third nitride semiconductor layer and said first nitride semiconductor layer is controlled by a voltage that is applied to said control electrode.

* * * * *